US012151159B2

(12) United States Patent
Bonanno

(10) Patent No.: US 12,151,159 B2
(45) Date of Patent: *Nov. 26, 2024

(54) HEADSET AND METHOD FOR OPERATING A HEADSET

(71) Applicant: Voyetra Turtle Beach, Inc., White Plains, NY (US)

(72) Inventor: Carmine J. Bonanno, White Plains, NY (US)

(73) Assignee: Voyetra Turtle Beach, Inc., White Plains, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/224,160

(22) Filed: Jul. 20, 2023

(65) Prior Publication Data

US 2023/0364504 A1 Nov. 16, 2023

Related U.S. Application Data

(63) Continuation of application No. 17/832,828, filed on Jun. 6, 2022, now Pat. No. 11,724,179, which is a continuation of application No. 17/684,040, filed on Mar. 1, 2022, now Pat. No. 11,383,158, which is a continuation of application No. 16/889,952, filed on
(Continued)

(51) Int. Cl.
*A63F 13/28* (2014.01)
*A63F 13/215* (2014.01)
*A63F 13/87* (2014.01)
*G07F 17/32* (2006.01)
*H03G 3/30* (2006.01)
*H04R 5/033* (2006.01)
*H04S 1/00* (2006.01)

(52) U.S. Cl.
CPC .............. *A63F 13/28* (2014.09); *A63F 13/87* (2014.09); *G07F 17/3209* (2013.01); *H03G 3/301* (2013.01); *H04R 5/033* (2013.01); *H04S 1/005* (2013.01); *A63F 13/215* (2014.09); *A63F 2300/572* (2013.01); *A63F 2300/6081* (2013.01)

(58) Field of Classification Search
CPC .... A63F 13/28; A63F 13/87; A63F 2300/572; A63F 2300/6081; G07F 17/32; G07F 17/3227; G07F 17/3209; H04R 1/1041; H04R 1/1061; H04R 3/00; H04R 3/14; H04R 5/033; H04R 5/04; H04R 2420/03; H04R 2420/05; H04R 2420/07; H04S 1/005; H04S 2400/01; H04S 2420/01
USPC .... 381/1, 17, 18, 19, 307, 309, 310, 26, 27, 381/74, 104, 107, 109; 463/35, 47; 455/575.2
See application file for complete search history.

(56) References Cited

U.S. PATENT DOCUMENTS

| 5,026,051 | A | 6/1991 | Lowe et al. |
| 5,556,107 | A | 9/1996 | Carter |

(Continued)

*Primary Examiner* — Xu Mei
(74) *Attorney, Agent, or Firm* — McAndrews, Held & Malloy, Ltd.

(57) ABSTRACT

A gaming unit and producing a game-audio output of a varying volume level and a chat-voice output is connected to headphones adapted to be worn by a player of the unit and connected to the gaming unit for making the chat-voice output and the game-audio output audible to the player. A circuit or software associated with the headphones can increase the chat-voice volume level generally proportionately to the game-audio volume level.

30 Claims, 7 Drawing Sheets

Related U.S. Application Data

Jun. 2, 2020, now Pat. No. 11,364,436, which is a continuation of application No. 13/949,754, filed on Jul. 24, 2013, now Pat. No. 10,695,668, which is a continuation of application No. 12/542,198, filed on Aug. 17, 2009, now Pat. No. 8,498,426.

(60) Provisional application No. 61/189,311, filed on Aug. 18, 2008.

(56) References Cited

U.S. PATENT DOCUMENTS

| | | |
|---|---|---|
| 5,771,297 A | 6/1998 | Richardson |
| 5,907,622 A | 5/1999 | Dougherty |
| 6,148,086 A | 11/2000 | Ciullo et al. |
| 6,805,633 B2 | 10/2004 | Hein, Jr. et al. |
| 7,359,671 B2 | 4/2008 | Richenstein et al. |
| 7,389,153 B2 | 6/2008 | Giaimo, III et al. |
| 7,636,444 B2 | 12/2009 | Cronin |
| 8,498,426 B2 | 7/2013 | Bonanno |
| 8,545,320 B2 | 10/2013 | Bonney et al. |
| 8,838,183 B2 | 9/2014 | Zatloukal et al. |
| 8,879,751 B2 | 11/2014 | Bonanno |
| 10,695,668 B2 | 6/2020 | Bonanno |
| 11,364,436 B2 | 6/2022 | Bonanno |
| 11,383,158 B2 * | 7/2022 | Bonanno ................ A63F 13/87 |
| 11,724,179 B2 * | 8/2023 | Bonanno ................ H03G 3/301 381/309 |
| 2005/0117761 A1 | 6/2005 | Sato |
| 2007/0133831 A1 | 6/2007 | Kim et al. |
| 2016/0303474 A1 * | 10/2016 | Kuruba Buchannagari ................ A63F 13/25 |

\* cited by examiner

HEADSET AND METHOD FOR OPERATING A HEADSET

CROSS REFERENCE TO RELATED APPLICATION

This application is a continuation of U.S. application Ser. No. 17/832,828, filed Jun. 6, 2022, which is a continuation of U.S. application Ser. No. 17/684,040, filed Mar. 1, 2022, (U.S. Pat. No. 11,383,158) which is a continuation of U.S. application Ser. No. 16/889,952, filed Jun. 2, 2020, (U.S. Pat. No. 11,364,436), which is a continuation of U.S. application Ser. No. 13/949,754, filed Jul. 24, 2013, (U.S. Pat. No. 10,695,668), which is a continuation of U.S. application Ser. No. 12/542,198, filed Aug. 17, 2009, (U.S. Pat. No. 8,498,426), which claims the benefit of U.S. provisional application No. 61/189,311, filed Aug. 18, 2008. The aforementioned documents are hereby incorporated herein by reference in their entirety.

FIELD OF THE INVENTION

The present invention relates to a headphone system. More particularly this invention concerns a headset and operating system for use with a game played on a personal computer or dedicated console.

BACKGROUND OF THE INVENTION

In multiplayer games that are played over a local area network or the internet, as described in US 2005/0245317 game audio and voice are combined with a pair of headphones during a multiplayer game. More particularly a typical computer game console, such as the Microsoft Xbox™ or Sony PlayStation™, is equipped with a headset that fits over one ear and includes a boom microphone positioned near the player's mouth. The sound of the game is provided via a set of stereo or multichannel audio outputs typically connected to a speaker system or television speakers.

The headset is used for communication in multiplayer computer games so that two or more players can compete against each other via a local network or over the Internet. When players are not located in the same room, verbal interaction in real time is accomplished via the headset with microphone. Multiple players located at different places can participate in the same game by using this type of voice communication system. When the players are in the same room, they may also want to interact verbally with one another. However, if they are wearing headphones that cover both ears, they may not be able to hear each other over the sound of the game audio in the headphones. Consequently, a single-ear headphone with microphone attachment is typically used so that one ear is free to hear communication from other players.

One problem with this form of game play is that the player is limited to hearing the sound of the game with only one ear, since the other ear is covered by the communications earpiece. Thus, for example, positional sound cues are lost because the sound is reduced to a mono signal when listened to with only one ear. This dramatically impacts the overall experience of the game, as compared to experiencing the game sound through a stereo headphone or surround-sound headphone. A second problem with this form of game play is that the game sound emanating from the speakers is often picked up by the headset microphone, feeding back to the other players who are interacting via voice communication. This prevents the game sound from being turned up too loud, further inhibiting the sonic experience while playing the game.

A third problem with this form of game play is that the game sound in the headphones has a wide dynamic range. In other words, at times a low volume level can rapidly increase to a loud level when, for instance, an explosion or other dynamic event occurs in the game. These loudness dynamics may be sustained for long periods of time, for instance during heated battle in an action game. A consequence of this wide dynamic range is that if the voice communication signals are set for a comfortable volume level during normal game passages, they cannot be heard over the loud game sound when dynamic game passages occur.

A common solution to the problem of listening to game audio via speakers and communicating via a single-ear headset with microphone is to integrate the microphone with a stereo or multichannel headphone so that the voices of other players can be heard along with the game sound using the same headphone. In this way, the game sound can be clearly heard, the voices of other players can be mixed into the game sound at a level separately adjusted from the game sound, and the microphone is isolated from the game sound by virtue of the sound being contained within the headphone ear cups and not emanating into the microphone's pickup area.

One problem with this integrated headphone solution is that the sound of the other player's voices is often unintelligible when the game sounds increase in level, say when the sound of explosions or intense battles occurs. In current manifestations of these headphones, the so-called "chat" volume of other players must constantly be adjusted to accommodate variations in game level, making it necessary for the player to momentarily lose control of the game as the hand moves from the game controller to adjust the chat volume level.

Another problem is that if the voices are sent in equal volume to the left and right ear speakers in stereo headphones, the resulting sound will seem to emanate from the center of the player's head. This makes it difficult to discern the voices from the game sounds, since they are all mixed together on the same lateral plane.

Another problem is that the wired connection between the game controller devices and the headphones can cause an interference signal to enter the ground connection on the headphones, which in the case of wireless headphones can inadvertently cause the wireless signal to either diminish in intensity or disappear altogether due to the overwhelming effect of the digital noise interference entering from the connection between the headphones and the game controller device.

Another problem is caused by the inability of the player to hear his own voice while wearing the headphones, which in turn causes him to speak more loudly than normal in order to compensate for the lack of audible feedback It is known to control the level of music in headphones or speakers in response to an external sound source. This is the subject of several prior art patents because it is desirable in some circumstances to have the intermittent use of a voice signal override the sound of music or other audio material.

For example, in U.S. Pat. No. 4,455,677, microphones are added to a headphone assembly to detect and mix ambient sounds along with the music being listened to with the headphones. The purpose is to allow users to communicate with each other while wearing headphones. The level of the music is not altered by the ambient sound and the ambient sound is not mixed until it exceeds a preset threshold level.

U.S. Pat. No. 5,647,011 describes a headphone sound system that turns off the music to a pair of headphones whenever an external sound threshold is exceeded, thereby allowing the listener to interrupt the music whenever an ambient sound exceeds the threshold level. A housing with a microphone and switching circuit connects between the CD player and headphones so that the sound from the CD player is switched to the sound of the microphone whenever the audio threshold is exceeded. While this invention allows someone to hear the voice by shutting off the music, it adversely affects the gaming experience.

U.S. Pat. No. 4,881,123 relates to a voice override in an amplitude control system for an audio entertainment system which suppresses the music signal so that it may be overridden by a voice signal. This is intended to be utilized as part of a public-address system used for both music and voice communications. Unlike other prior-art systems that provide means to allow the music signal to be abruptly overridden by the voice signal, the voice override circuit in US '123 provides for a gradual attenuation of the music to a predetermined level by the voice signal and a subsequent gradual returning of the music to its normal level upon termination of the voice signal.

U.S. Pat. No. 6,993,480 describes a method of improving the intelligibility of speech in environments where the ambient noise level masks or distorts the speaker's voice as it is heard by the listener. This technique does not simply increase the volume level of the voice to override the noise, but instead uses sophisticated signal processing techniques to enhance the speech using transfer functions to alter the sound characteristics in ways that compensate for the ambient noise. The technique modifies the voice gain in response to some property of the filtered and processed signal. Although this technique is most likely effective in improving speech intelligibility in noisy environments, the implementation is too expensive and complicated to implement in a simple gaming headphone apparatus. Although a simple form of speech intelligibility improvement is described as using an automatic gain control block, the envelope control signal of this gain control block is derived from the speech signal, not from the music or game sound source.

OBJECTS OF THE INVENTION

It is therefore an object of the present invention to provide improved voice communication for a gaming headset.

Another object is the provide a method of controlling the sound level of the player voice or voices without adversely affecting the gaming experience, as a serious gamer is not going to sacrifice the game to player-to-player communication.

SUMMARY OF THE INVENTION

A gaming unit according to the invention having a controller and producing a game-audio output of a varying volume level and a chat-voice output is connected to headphones adapted to be worn by a player of the unit and connected to the gaming unit and to the microphone for making the chat-voice output and the game-audio output audible to the player. A circuit or is software associated with the headphones can increase the chat-voice volume level generally proportionately to the game-audio volume level.

Thus when the game gets loud, the chat voices will increase in volume and remain audible. When the game returns to a lower volume, the chat voices will follow and return to a preset level.

According to a further feature of the invention there is an envelope detector for generating a control signal varying in proportion to the game-audio volume level and a variable-gain stage receiving the chat-voice output and the control signal for increasing the chat-voice output generally proportionately to the game-audio volume level. This simple circuit effectively carries out the invention.

According to the invention a microphone receives voice audio from the player of the game and produces a voice-audio output of predetermined normally low volume level, and mixer for adding the voice-audio output to the chat-voice output. Optocouplers decouple the voice-chat and microphone signals from the gaming unit to reduce noise. In addition a threshold detector is connected to the microphone for cutting off the chat-voice output when an output of the microphone is below a threshold level.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
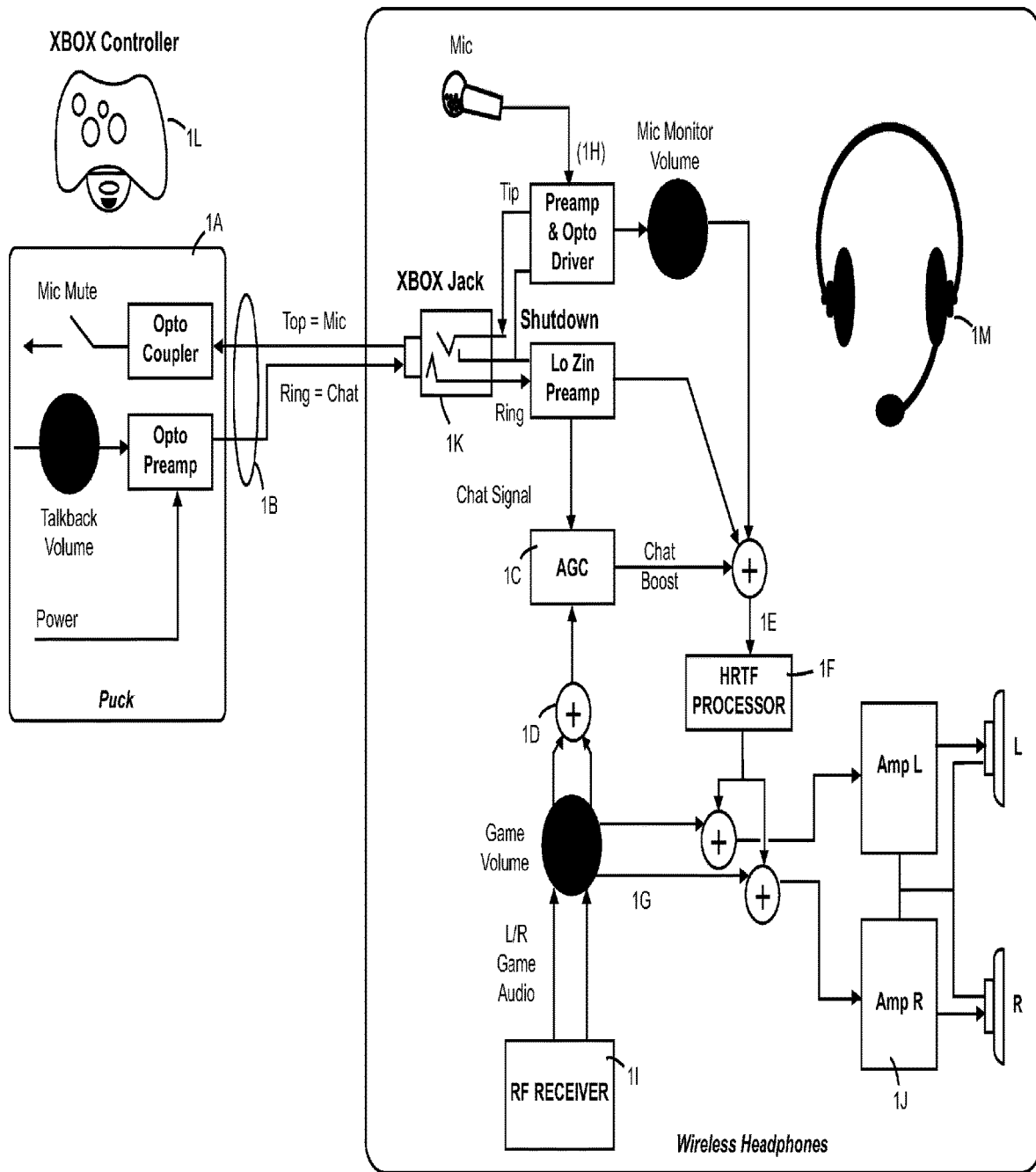
FIG. 1 is a schematic diagram of a typical system according to the invention.

This invention improves the audibility of voice communication while listening to game audio over stereo or multichannel headphones during multiplayer gaming with a game console or personal computer. A typical embodiment of the invention is illustrated in FIG. 1, which shows the signal flow of the voice chat and microphone signals between wireless gaming headphones and a game controller.

It is important to note that the operation of this invention is not limited in its application to a game console equipped with a game controller. For instance, the invention operates in essentially the same manner when applied to a personal computer used for playing games, as long as the chat-voice and game-audio signals emanating from the personal computer are separated. For example, the game-audio signal may be connected to the headphones from the personal computer sound card output and the chat-voice signal may be supplied to the headphones via a so-called Universal Serial Bus (USB) interface that transfers audio in serial digital format to a digital-to-analog converter in the headset. In this example, the game-audio and chat-voice signals are separate and distinct inside the headset, thereby enabling the invention to operate in the same manner as if the signals were emanating from a game console with a game controller.

Therefore, the following description refers to the game console application of the invention merely for the purpose of simplicity and illustration and not to limit the application of the invention to game consoles.

The game controller 1A is connected to a game console or personal computer and is used as an input device for controlling the game. The "talkback" or "chat" signals from on-line players are routed through the game controller 1L and connected to the headphones 1M via a multiconductor wire 1B which on one side is connected to the headphones and on the other side is connected to the game controller via a plastic "puck" which houses a talkback volume control, microphone mute switch and optical coupling circuitry. A pair of optical circuits inside the "puck" are used for electrically decoupling the game controller from the headphone, thereby eliminating interference inside the headphone caused by the digital noise inside the game controller.

Inside the headphones 1M, the chat signal from the game controller is routed to a preamplifier designed to interface with the optical circuit inside the puck. The output of this preamp is routed to a gain control circuit 1C whose gain is controlled by the game audio level 1D such that it amplifies the chat volume as the game audio level increases. In one embodiment of the circuit, this amplified chat signal is summed with the unamplified chat signal so that the final chat signal 1E will be no lower in volume than the unamplified signal, yet its volume will increase as the game volume increases, thereby assuring that the chat can always be heard over the louder game level. Other variations of this circuit may also be used to derive the same function, for example, a gain control circuit whose minimum level is be fixed and whose gain increases in proportion to the game volume signal, or a digital signal processor which accomplishes the same function by manipulating the digital representation of the same signals.

A positional audio circuit 1F uses head-related-transfer function (HRTF) processing to position the chat audio outside the stereo plane, so that it seems to originate outside the head, thereby making the chat signal more intelligible by separating it from the game audio signal 1G. Such HRTF processing is commonly used to externalize stereo signals in headphones to produce the aura of the sound originating to the front or rear of the listener's head. This may be accomplished by processing a portion of the left and right stereo signals with filters that simulate the frequency response of the human ears, then delaying the filtered left and right signals and sending a portion of each to the opposite ear. This HRTF processing technique can also be applied to a monophonic signal, such as the chat audio, buy filtering and delaying the monophonic signal and sending it to the left and right channels with different filtering and delay times, thereby producing the same "externalizing" effect that makes the chat signal seem as if it is originating outside the head The microphone signal 1H is routed to a preamplifier designed to drive the optocoupler inside the puck. The microphone signal is also routed back to the game controller 1A via one of the wires inside the talkback cable 1B so that other players can hear the player speak. A mute switch inside the puck allows the microphone to be shut off when the player does not want to be heard. The output of the microphone preamplifier inside the headphone is also routed to a microphone monitor volume control and summed with the chat signal 1E so the user can hear himself speak inside the headphones. The volume control allows the user to adjust the level of his own voice heard inside the headphones. The microphone and chat signals are both processed by the HRTF processor so both signals are separated from the game audio.

An RF receiver 11 receives the game audio signals from a transmitter of the game console or PC. The stereo output from this receiver is summed with the mono output of the head-related transfer function (HRTF) processor and routed to the amplifiers 1J that drive the headphone speakers, thereby allowing the user to hear the HRTF processed chat plus microphone signals, along with the stereo game audio. The RF connection is herein described as an example of how the game audio signals may be connected to the headphones. The connection may also be via a wire and has no bearing on the functioning of the invention.

A shutdown switch inside the headphone jack 1K turns off the microphone and chat signals inside the headphones if the talkback cable is not inserted into the headphones, thereby eliminating any ambient noise picked up by the microphone and background noise introduced by the game controller.

Figure 2:
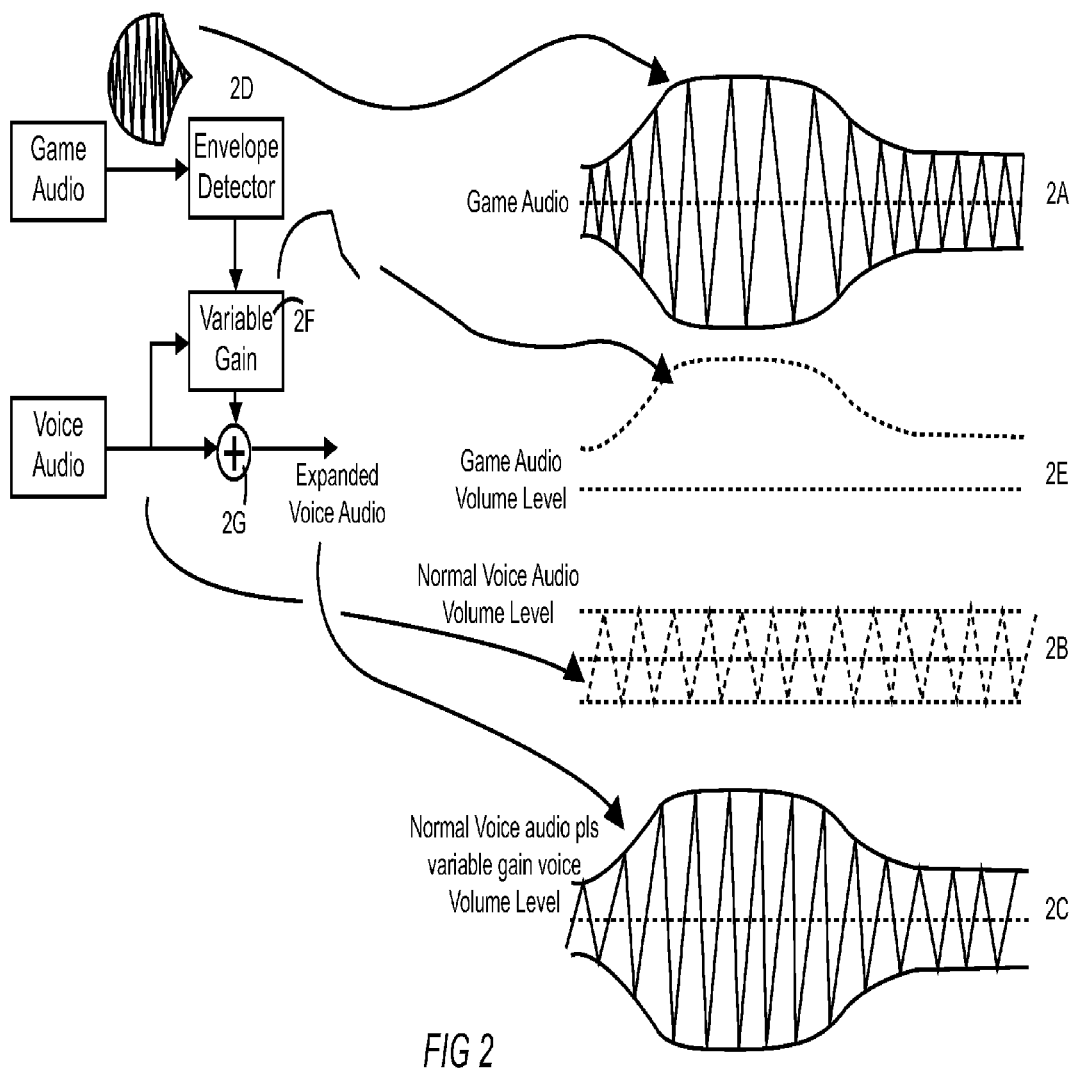
FIG. 2 is a diagram illustrating dynamic chat control in accordance with the invention.

As shown in FIG. 2, as the game volume 2A increases, for example in loud battle scenes, the voice audio 2B of the players trying to communicate remains at the same level and would normally be overwhelmed by the loud game sounds, making the chat difficult to hear. Thus, according to the invention the chat voices increase in volume in tandem with the level of game sound as shown at 2C, so that the amplitude of chat will be no lower than its normal level 2B when the game sound is low, and increases to a louder level if the game volume increases 2A.

This dynamic chat amplification is accomplished by using an envelope detector circuit 2D to generate a control signal 2E that varies in proportion with the amplitude of the game sound. This signal is then used to control a variable gain stage 2F that amplifies the chat audio level and adds it to the unamplified chat signal 2G, thereby increasing the chat level whenever the game level increases.

The present invention allows the game audio to stay at the normal level, thereby preserving the original dynamics, while the voice is increased in tandem with the game volume, thereby allowing the voice to be heard over increases in volume levels of the music or game sound. When the music or game volume returns to a normal level, the voice volume also adjusts down to its normal level, thereby moving in tandem with the increases in volume of the music and game audio. The technique is simple and straightforward, requiring no cumbersome and expensive filtering techniques to achieve enhanced intelligibility.

Figure 3:
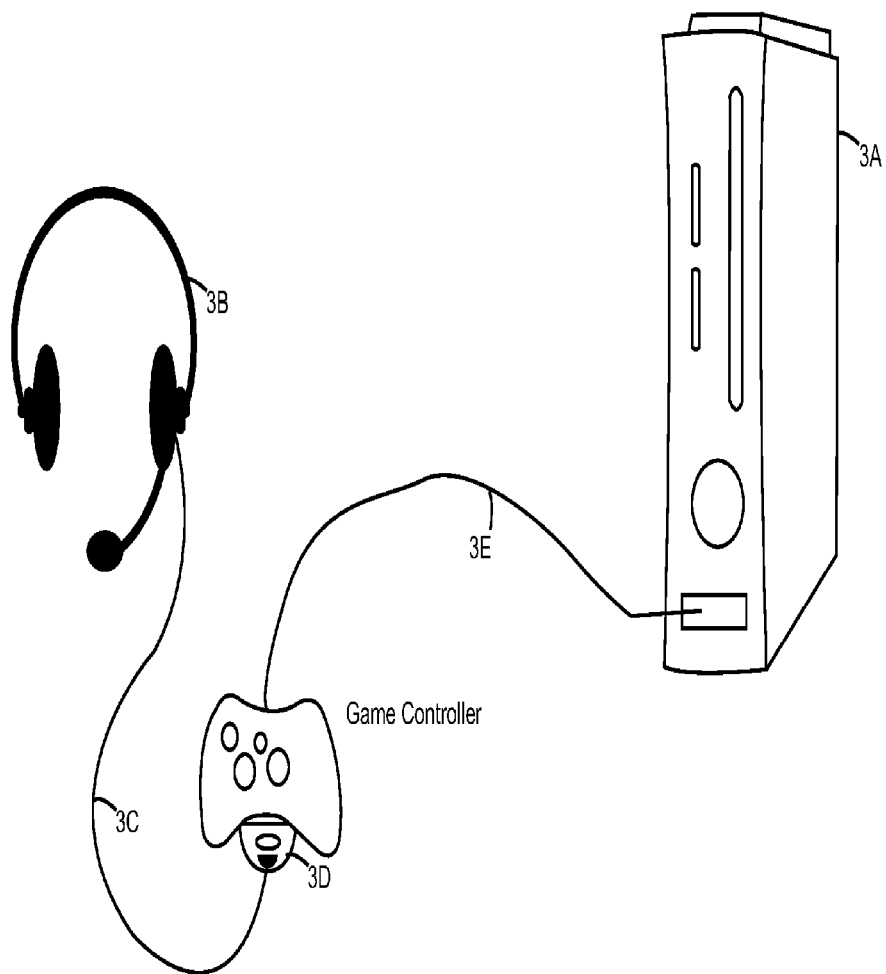
FIG. 3 illustrates a system for isolating the headphones and game controller.

The invention also serves to eliminate the interference resulting from the electrical connection between the game controller and wireless headphones used for listening to the game and chat audio signals. As described above, digital noise from the game controller can be introduced into the headphones via the talkback cable wires, drastically affecting the signal reception of the RF receiver in the headphones. This problem is dealt with as shown in FIG. 3 in that the voice and chat signals from the game console 3A are connected to the wireless headphones 3B with a talkback cable 3C. One end of the talkback cable 3C is connected to the headphones 3B by a small jack and the other end is connected to the game controller through a small plastic device or puck 3D that contains a mute switch for silencing the headphone microphone and a volume control to adjust the chat level heard from other players.

The game controller 3A is typically connected via a multiwire cable 3E to the game console using a so-called Universal Serial Bus (USB) connection. Since this connection uses a digital signal, and also since the game unit. 3A contains digital circuitry, the ground signal on the talkback cable has a high level of digital noise, an erratic voltage of high frequency that can cause interference in radio signals.

When the talkback cable is inserted into the wireless headphones, the digital noise is transferred to the ground signal inside the headphones and in turn is amplified by the headphone's RF circuit used for receiving the game audio from the console unit. This amplification of the digital noise degrades the performance of the RF receiver circuit inside the headphones, adversely affecting the audio reception and causing the game volume level to decrease or stop altogether.

According to the invention, the digital noise on the talkback cable is eliminated by providing an optical decoupling circuit in the game controller connector 3D, thereby breaking the connection between the headphones and game controller and preventing the digital noise from entering the RF amplifier circuits inside the headphones.

Figure 4:
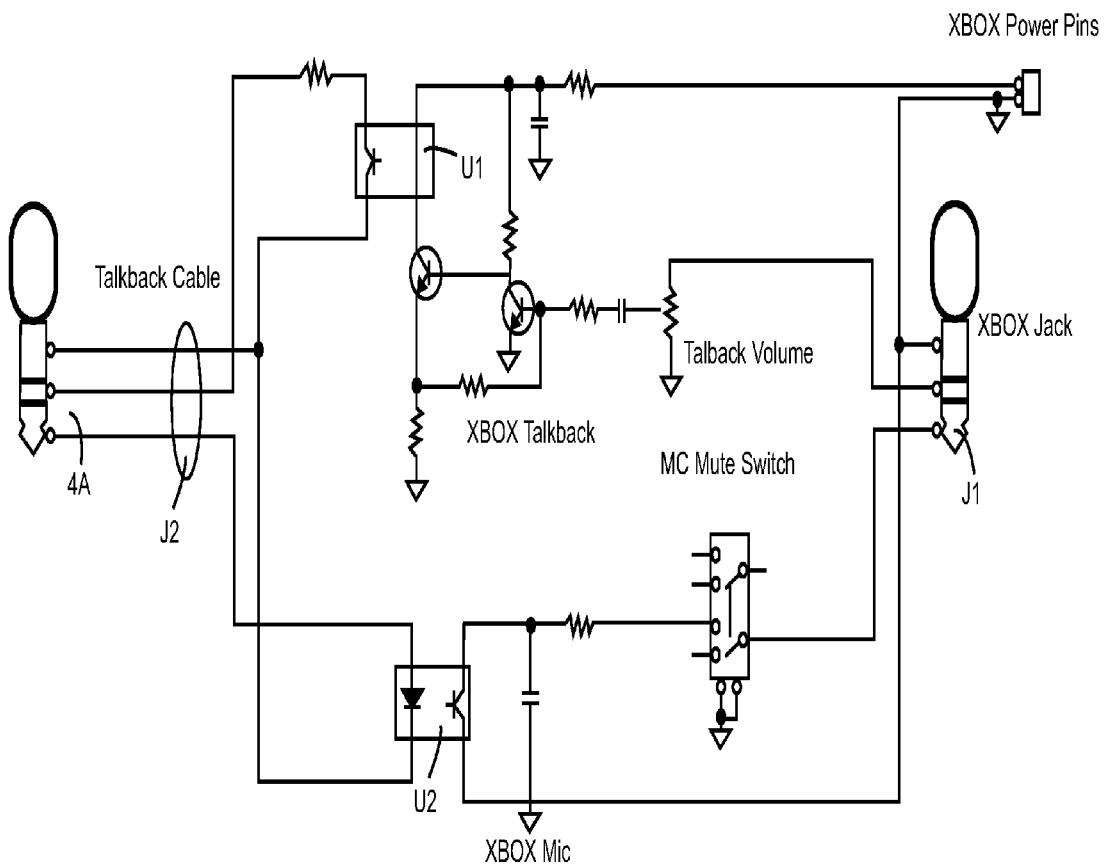
FIG. 4 is a schematic diagram of a decoupling circuit according to the invention.

Thus as shown in FIG. 4 the signals from the game controller are connected to Xbox jack J1 that has a microphone input jack tip and chat signal output jack ring. The headphones are connected via the talkback cable 4A which has three conductors—ground, chat and microphone—connected to jack J2. Two optocouplers U1 and U2 decouple the microphone and chat signals from the game controller by isolating the currents via a modulated LED which drives an optical transistor, both inside each optocoupler. The optocouplers are operated in their linear regions so that signal distortion is minimized.

Since the headphone signals are not electrically connected to the game controller signals, there is no path on which the digital noise may pass to the headphones, thereby isolating them from the interference that would result from said digital noise being transferred to the headphones.

Figure 5:
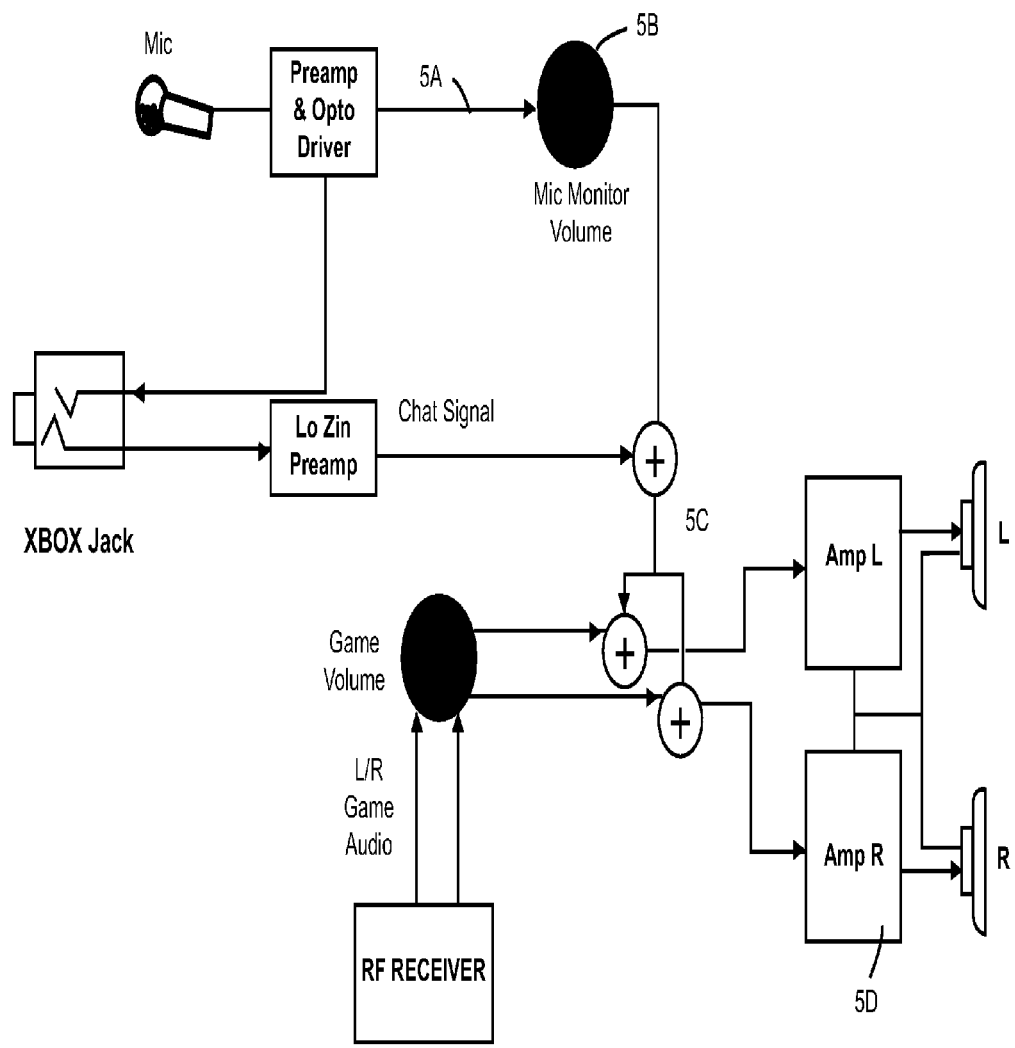
FIG. 5 is a block diagram illustrating the system for feeding the player's voice back to him/herself.

The invention also provides means by which the player can hear himself speak inside the headphones so he does not inadvertently speak louder in order to hear his own voice. This is accomplished by mixing in a portion of the amplified microphone signal along with the game and chat signals inside the headphones, allowing the player to hear his voice along with the sound of the game and the voices of other players, as illustrated in FIG. 5. Here, the microphone signal 5A is routed to a volume control 5B which allows a portion of the microphone signal to be mixed with the chat and game signals via mixing stage 5C. This allows the user to adjust the level of his own voice as heard in the speakers 5D, thereby minimizing his tendency to speak louder due to the inability of hearing his own voice.

One side effect of this microphone monitoring feature is that the sound of external ambient noise is picked up by the microphone and amplified by the speaker amplifiers. This ambient noise can become distracting when the headphones are not used for game play, for example, when listening to music, television or watching a movie with the headphones. Therefore, this invention disconnects the microphone and chat signals when the talkback cable is not inserted into the headphone jack.

Figure 6A:
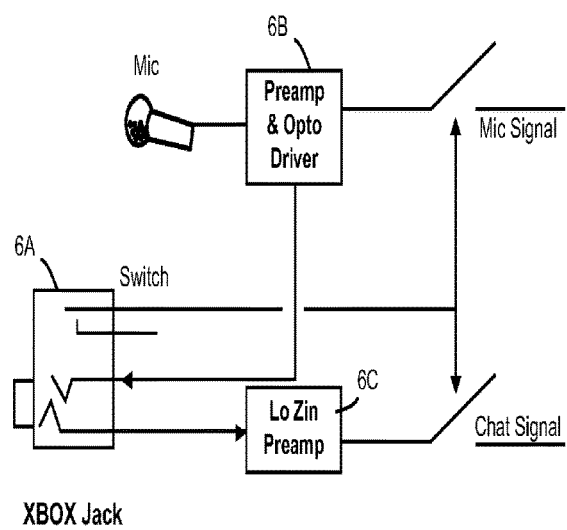
FIGS. 6A and 6B are diagrams of different microphone hookups according to the invention.

One method to accomplish this is illustrated in FIG. 6A. Here, a switched jack 6A disables the outputs from the microphone 6B and chat input 6C when the cable is not inserted into the jack. This prevents the microphone and chat signals from passing to the amplifier when they are not being used, thereby eliminating ambient noise pickup from the microphone as well as the background noise introduced by the game controller via the talkback signal path.

Figure 6B:
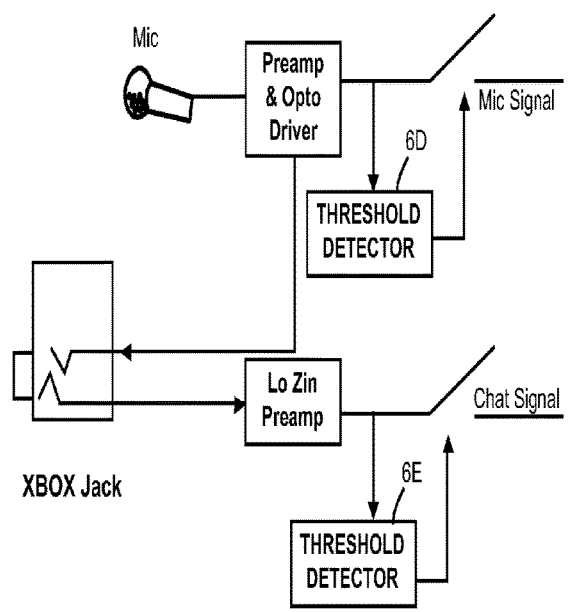

Another method of disconnecting the microphone and chat signals is illustrated in FIG. 6B. Here, a pair of threshold detection circuits 6D and 6E turn off the microphone and talkback signals whenever they are below a particular amplitude threshold. When the either signal is above the threshold, the output is turned on for that signal, thereby eliminating the noise from this signal path whenever the signal is too low to be significant.

On stereo headphones, a sound emanating from only one speaker is heard only on the side of that speaker, a sound with equal volume on both speakers is heard in the middle of the head, and a sound with unequal volume on the left and right speakers is heard shifted to the side of the louder speaker, an effect also referred to as panning. Typically, the chat signal would be panned to the center by providing equal volume to both speakers. However, because the game sounds are also panned in the stereo spectrum between the left and right ears, it is more difficult to hear the chat signal when it is heard in the center of the head along with the game signal.

To make the chat signal more intelligible, it is desirable to have the sound emanate from a position outside of the head so that it is distinct and separate from the game sound. Therefore, in this invention, HRTF processing is applied to the chat signal so that it appears to emanate from either in front, behind, to the side or in any other position outside of the listener's head. This HRTF effect makes it significantly easier to understand the voices of other players by distinctly separating the chat signal from the game signal's left to right position.

Figure 7:
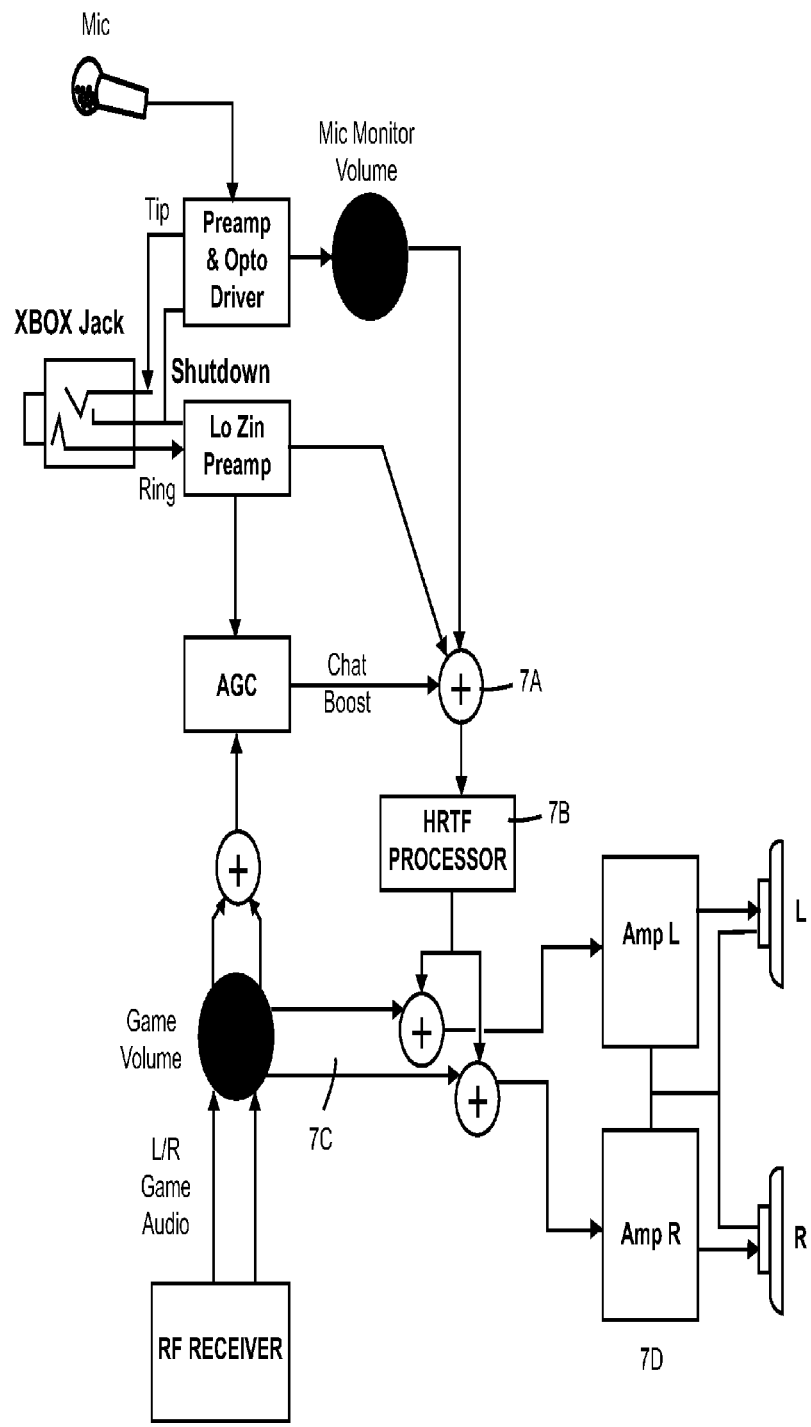
FIG. 7 is another schematic showing how the microphone and chat signals are mixed.

This process is illustrated in FIG. 7 which shows the microphone and chat signals mixed together as a single mono signal 7A and processed by an HRTF or other form of positional audio circuit 7B which converts it into a stereo signal which is mixed with the left and right game signal 7C characteristics such that it moves the mono signal into a virtual position outside of the listener's head when heard in the stereo speakers 7D.

It should be noted that although the description of the invention herein is based upon discrete analog hardware, the functionality may also be obtained by implementing these processes in software residing in a personal computer, game console or in a stand-alone processor such as a Digital Signal Processor (DSP) in the headphones or connected externally to the headphones. Therefore, software implementations of the invention described herein are within the range of this invention.

I claim:

1. A headset, the headset comprising:
    a pair of speakers operable to output sound according to one or more of a game signal, a chat signal and a microphone signal;
    a speaker volume controller operable to adjust an output level of the pair of speakers;
    a circuit operable to combine the chat signal and the game signal; and
    a microphone operable to receive the microphone signal, wherein:
       a level of the microphone signal is operably controlled independently from the game signal and the chat signal.

2. The headset of claim 1, wherein the speaker volume controller comprises an analog circuit.

3. The headset of claim 1, wherein the speaker volume controller comprises a signal processor.

4. The headset of claim 1, wherein the speaker volume controller comprises a plastic puck.

5. The headset of claim 1, wherein the circuit is operable to mute the chat signal.

6. The headset of claim 1, wherein the level of the microphone signal is controlled by software via an interface in a game console.

7. The headset of claim 1, wherein when the microphone signal is below a threshold, the microphone signal is automatically muted.

8. The headset of claim 1, wherein when the chat signal is below a threshold, the chat signal is automatically muted.

9. The headset of claim 1, wherein the headset is operably coupled wirelessly to a game console.

10. The headset of claim 1, wherein the microphone is selectably muted.

11. The headset of claim 1, wherein the headset comprises a circuit operable to spatially process the game signal to position sound around the headset.

12. The headset of claim 1, wherein the headset comprises a circuit operable to spatially process the chat signal to position sound around the headset.

13. The headset of claim 1, wherein the headset comprises a wireless receiver compatible with a Microsoft Xbox™ console.

14. The headset of claim 1, wherein the game signal is from a Microsoft Xbox™ console.

15. The headset of claim 1, wherein the chat signal is from a personal computing device.

16. A method for operating a headset, the method comprising:
   receiving, via a receiver, a game signal and a chat signal;
   receiving, via a microphone, a microphone signal;
   outputting sound, via a pair of speakers, according to one or more of the game signal, the chat signal and the microphone signal;
   adjusting an output level of the pair of speakers via a speaker volume controller;
   combing the chat signal and the game signal; and
   adjusting a level of the microphone signal independently from the game signal and the chat signal.

17. The method of claim 16, wherein the speaker volume controller comprises an analog circuit.

18. The method of claim 16, wherein the speaker volume controller comprises a signal processor.

19. The method of claim 16, wherein the speaker volume controller comprises a plastic puck.

20. The method of claim 16, wherein the method comprises selectably muting the chat signal.

21. The method of claim 16, wherein the method comprises adjusting the level of the microphone signal via a software interface of a game console.

22. The method of claim 16, wherein the method comprises automatically muting the microphone signal when the microphone signal is below a threshold.

23. The method of claim 16, wherein the method comprises automatically muting the chat signal when the chat signal is below a threshold.

24. The method of claim 16, wherein the receiver is a wireless receiver.

25. The method of claim 16, wherein the method comprises selectably muting the microphone.

26. The method of claim 16, wherein the method comprises spatially processing the game signal to position sound around the headset.

27. The method of claim 16, wherein the method comprises spatially processing the chat signal to position sound around the headset.

28. The method of claim 16, wherein the wireless receiver is compatible with a Microsoft Xbox™ console.

29. The method of claim 16, wherein the game signal is from a Microsoft Xbox™ console.

30. The method of claim 16, wherein the chat signal is from a personal computing device.

* * * * *